United States Patent
Chen (10) Patent No.: US 12,268,080 B2
(45) Date of Patent: Apr. 1, 2025

(54) PACKAGING STRUCTURE HAVING PROTRUSION-RECESS STRUCTURES AND DISPLAY PANEL

(71) Applicants: HUIZHOU CHINA STAR OPTOELECTRONICS DISPLAY CO., LTD., Guangdong (CN); SHENZHEN CHINA STAR OPTOELECTRONICS SEMICONDUCTOR DISPLAY TECHNOLOGY CO., LTD, Guangdong (CN)

(72) Inventor: Lixuan Chen, Guangdong (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/607,443

(22) PCT Filed: Sep. 29, 2021

(86) PCT No.: PCT/CN2021/121725
§ 371 (c)(1),
(2) Date: Oct. 29, 2021

(87) PCT Pub. No.: WO2023/044948
PCT Pub. Date: Mar. 30, 2023

(65) Prior Publication Data
US 2024/0032388 A1    Jan. 25, 2024

(30) Foreign Application Priority Data
Sep. 24, 2021    (CN) .......................... 202111122040.X (51) Int. Cl.
*H10K 59/80*    (2023.01)
*H10K 102/00*    (2023.01)

(52) U.S. Cl.
CPC ......... *H10K 59/873* (2023.02); *H10K 59/879* (2023.02); *H10K 2102/3026* (2023.02)

(58) Field of Classification Search
CPC ............................................ H10K 2102/3026
See application file for complete search history.

(56) References Cited

U.S. PATENT DOCUMENTS

2022/0102677 A1*    3/2022    Liu .................... H10K 59/8791

FOREIGN PATENT DOCUMENTS

| CN | 109143445 | 1/2019 |
|----|-----------|--------|
| CN | 109143677 | 1/2019 |
| CN | 109638173 | 4/2019 |

(Continued)

*Primary Examiner* — Suberr L Chi (57) ABSTRACT

A packaging structure and a display panel are provided. The packaging structure includes a first inorganic layer, a first protrusion-recess structure, and a second inorganic layer. The first protrusion-recess structure is formed on the first inorganic layer. The second inorganic layer covers the first inorganic layer and the first protrusion-recess structure. A refractive index of the first protrusion-recess structure is less than a refractive index of the second inorganic layer, or the refractive index of the first protrusion-recess structure is greater than the refractive index of the second inorganic layer.

18 Claims, 4 Drawing Sheets

(56) References Cited

FOREIGN PATENT DOCUMENTS

| | | |
|---|---|---|
| CN | 109817823 | 5/2019 |
| CN | 209607764 | 11/2019 |
| CN | 209785979 | 12/2019 |
| CN | 110970572 | 4/2020 |
| CN | 112151693 | 12/2020 |
| CN | 212695182 | 3/2021 |
| CN | 113036054 | 6/2021 |
| CN | 113130753 | 7/2021 |

* cited by examiner

PACKAGING STRUCTURE HAVING PROTRUSION-RECESS STRUCTURES AND DISPLAY PANEL

RELATED APPLICATIONS

This application is a National Phase of PCT Patent Application No. PCT/CN2021/121725 having International filing date of Sep. 29, 2021, which claims the benefit of priority of China Patent Application No. 202111122040.X filed on Sep. 24, 2021. The contents of the above applications are all incorporated by reference as if fully set forth herein in their entirety.

FIELD AND BACKGROUND OF THE INVENTION

The present disclosure relates to the technical field of display, and particularly, to a packaging structure and a display panel.

In order to improve an optical performance of a display device, such as viewing angle performance or brightness, a known method is to attach an optical film with microstructures to a light-emitting surface of the display and improve the viewing angle performance or brightness of the display device through the microstructures formed on the optical film. However, an effect of sticking a film onto an outside of the display device is limited by the size and precision of a film forming process of a roll-to-roll process, and material of the microstructures.

SUMMARY OF THE INVENTION

Technical Problem

In view of this, the present disclosure provides a packaging structure and a display panel, which may solve the technical problem that the improvement of the optical performance of a conventional display device is limited by the process and materials.

Technical Solutions

The present disclosure provides a packaging structure, and the packaging structure comprises:
  a first inorganic layer;
  a first protrusion-recess structure formed on the first inorganic layer, and
  a second inorganic layer covered the first inorganic layer and the first protrusion-recess structure, wherein a refractive index of the first protrusion-recess structure is less than a refractive index of the second inorganic layer, or the refractive index of the first protrusion-recess structure is greater than the refractive index of the second inorganic layer.

In one embodiment, the second inorganic layer comprises a second protrusion-recess structure. The second protrusion-recess structure is formed on a surface of the second inorganic layer close to the first inorganic layer, and the second protrusion-recess structure and the first protrusion-recess structure matches with each other.

In one embodiment, the first protrusion-recess structure comprises a protrusion. The protrusion comprises a first diffusion surface and a second diffusion surface disposed oppositely. The first diffusion surface is close to a surface of the first inorganic layer in a direction away from the second diffusion surface, and the second diffusion surface is close to the surface of the first inorganic layer in a direction away from the first diffusion surface.

In one embodiment, the protrusion further comprises a central surface, and the central surface is disposed between the first diffusion surface and the second diffusion surface.

In one embodiment, the first inorganic layer and the first protrusion-recess structure are formed integrally.

In one embodiment, the first protrusion-recess structure comprises a plurality of protrusions. The plurality of protrusions are frustums. The plurality of protrusions are arranged at intervals along a first direction and extend along a second direction. The second direction intersect the first direction. A distance between the two adjacent protrusions ranges from 20 μm to 60 μm, and a height of the protrusion ranges from 1 μm to 5 μm.

In one embodiment, a material of the first protrusion-recess structure is an organic material, and the refractive index of the first protrusion-recess structure is equal to a refractive index of the first inorganic layer or is between the refractive index of the first inorganic layer and the refractive index of the second inorganic layer.

In one embodiment, the material of the first protrusion-recess structure is organic photoresist.

In one embodiment, the first protrusion-recess structure comprises a plurality of protrusions. The plurality of protrusions are frustums. The plurality of protrusions are arranged at intervals along a first direction and extend along a second direction. The second direction intersect the first direction. A distance between the two adjacent protrusions ranges from 20 μm to 60 μm, and a height of the protrusion ranges from 1 μm to 5 μm. A ratio of the height of the protrusion to a maximum width of the protrusion along the first direction ranges from 1.5:1 to 1:1.

In one embodiment, the packaging structure further comprises a third protrusion-recess structure and a third inorganic layer. The third protrusion-recess structure is formed on one side of the second inorganic layer away from the first inorganic layer. The third inorganic layer covers the third protrusion-recess structure and the second inorganic layer.

The present disclosure provides a display panel, and the display panel comprises:
  a substrate;
  a dis play device disposed on the substrate, and
  a packaging structure described above. The packaging structure is disposed on one side of the display device away from the substrate. The first inorganic layer is disposed between the display device and the second inorganic layer.

Beneficial Effects

The packaging structure according to the present disclosure may form an optical microstructure inside a functional layer of a conventional display device without disposing an additional optical film, thereby using the functional layer of the conventional display device to achieve purposes of various optical controls.

BRIEF DESCRIPTION OF THE SEVERAL VIEWS OF THE DRAWINGS

In order to explain the technical solutions of the present disclosure more clearly, the following will briefly introduce the drawings used in the description of the embodiments or the related art. Obviously, the drawings described below are only some embodiments of the present disclosure. For those skilled in the art, other drawings can be obtained based on these drawings without making creative efforts.

DESCRIPTION OF SPECIFIC EMBODIMENTS OF THE INVENTION

The technical solutions of the present disclosure will be described clearly and completely in combined with the drawings of the present disclosure. Obviously, the described embodiments are only one part of the embodiments of the present disclosure, but not all of the embodiments. Based on the embodiments of the present disclosure, all other embodiments obtained by a person skilled in the art without making creative efforts fall within the claim scope of the present disclosure.

In the present disclosure, unless clearly stipulated and defined otherwise, a first feature "above" or "below" a second feature may comprise direct contact between the first feature and second feature or may also comprise indirect contact between the first feature and second feature but through other features between them. Moreover, the first feature "above", "on", and "over" the second feature comprise the first feature directly above and obliquely above the second feature, or it simply means that a level of the first feature is higher than a level of the second feature. The first feature "below", "beneath" and "under" of the second feature comprise the first feature directly below and obliquely below the second feature, or it simply means that the level of the first feature is lower than the level of the second feature. Furthermore, the terms "first" and "second" are merely used for description purposes, and cannot be understood as indicating or implying relative importance or implicitly indicating the number of indicated technical features. Therefore, the features defined with "first" and "second" may explicitly or implicitly comprise one or more features.

Figure 1:
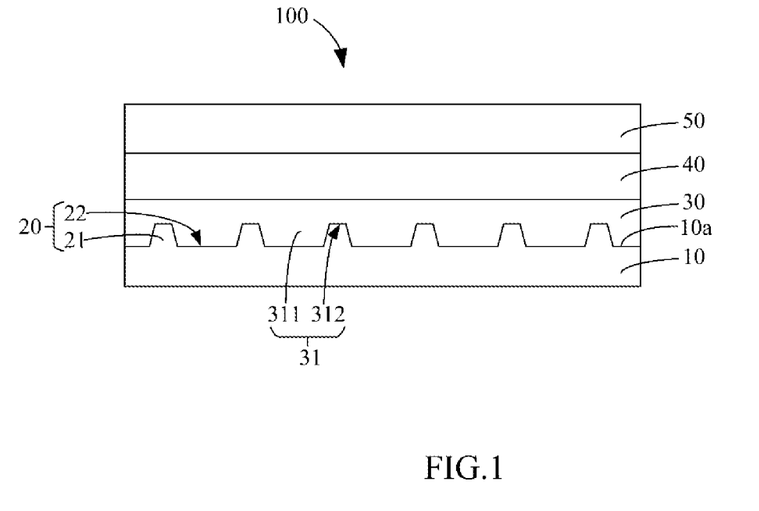
FIG. 1 is a schematic structural view of a packaging structure of a first embodiment of the present disclosure.

Please refer to FIG. 1. A packaging structure 100 provided by the present disclosure may be used for a packaging of a display device, such as an organic light emitting diode (OLED) display device, a sub-millimeter light emitting diode (Mini-LED) display device, a micro-light emitting diode (Micro-LED) display device, a quantum dots light-emitting diode (QLED) display device. The packaging structure 100 may isolate water vapor, protect the display device and enhance the stability of the display device.

The packaging structure 100 comprises a first inorganic layer 10, a first protrusion-recess structure 20, and a second inorganic layer 30. The first protrusion-recess structure 20 is formed on the first inorganic layer 10. The second inorganic layer 30 covers the first inorganic layer 10 and the first protrusion-recess structure 20. A refractive index of the first protrusion-recess structure 20 is less than a refractive index of the second inorganic layer 30, or the refractive index of the first protrusion-recess structure 20 is greater than the refractive index of the second inorganic layer 30. Corresponding to the first protrusion-recess structure 20, the second inorganic layer 30 comprises a second protrusion-recess structure 31. The second protrusion-recess structure 31 is formed on a surface 10a of the second inorganic layer 30 close to the first inorganic layer. The second protrusion-recess structure 31 and the first protrusion-recess structure 20 matches with each other. It should be noted that when the packaging structure 100 of the present disclosure is disposed in a display panel, the first inorganic layer 10 is closer to the display device than the second inorganic layer 30.

Since the packaging structure 100 is used to package the display device, all of the first inorganic layer 10, the second inorganic layer 30, and the first protrusion-recess structure 20 are light-transmitting materials. Optionally, a light transmittance of the first inorganic layer 10, the second inorganic layer 30, and the first protrusion-recess structure 20 is above 80%. A material of the first inorganic layer 10 may comprise at least one of silicon oxide, silicon nitride, silicon oxynitride, aluminum oxide, and titanium oxide. A material of the second inorganic layer 30 may comprise at least one of silicon oxide, silicon nitride, silicon oxynitride, aluminum oxide, and titanium oxide. A material of the first protrusion-recess structure 20 may comprise at least one of silicon oxide, silicon nitride, silicon oxynitride, aluminum oxide, and titanium oxide, or the material of the first protrusion-recess structure 20 may be an organic material. Specifically, the material of the first protrusion-recess structure 20 may be organic photoresist.

The refractive index of the first inorganic layer 10, the first protrusion-recess structure 20, and the second inorganic layer 30 may increase sequentially or decrease sequentially. Alternatively, the refractive index of the first inorganic layer 10 may also be equal to the refractive index of the first protrusion-recess structure 20.

Optionally, the refractive index of the first protrusion-recess structure 20 is less than the refractive index of the second inorganic layer 30. The first inorganic layer 10 and the first protrusion-recess structure 20 are formed integrally. The sentence "the first inorganic layer 10 and the first protrusion-recess structure 20 are formed integrally" means that the first inorganic layer 10 and the first protrusion-recess structure 20 are made of the same material and manufactured through the same manufacturing process. The first inorganic layer 10 is directly connected to the first protrusion-recess structure 20. The refractive index of the first inorganic layer 10 (i.e., the refractive index of the first protrusion-recess structure 20) may be less than the refractive index of the second inorganic layer 30. The packaging structure 100 may form the first inorganic layer 10 and the first protrusion-recess structure 20 by etching, and then deposit and form the second inorganic layer 30 to cover the first inorganic layer 10 and the first protrusion-recess structure 20.

In a specific embodiment, since silicon oxynitride or silicon nitride which contains nitrogen has a high refractive index and silicon oxide which contains oxygen has a low refractive index. The first inorganic layer 10 may be silicon oxide, and the second inorganic layer 30 may be silicon oxynitride. The refractive index of the first inorganic layer 10 may ranges from 1.5 to 1.55, and the refractive index of the second inorganic layer 30 may ranges from 1.55 to 1.95. Alternatively, the first inorganic layer 10 may be silicon oxide, and the second inorganic layer 30 may be silicon nitride. The refractive index of the first inorganic layer 10 may ranges from 1.5 to 1.55, and the refractive index of the second inorganic layer 30 may ranges from 2.0 to 2.2. Since a refractive index of aluminum oxide is close to a refractive index of silicon oxide, the silicon oxide of the first inorganic layer 10 may be replaced with aluminum oxide. Then, the first inorganic layer 10 may be aluminum oxide, and the second inorganic layer 30 may be silicon oxynitride or silicon nitride. It can be understood that the first inorganic layer 10 and the second inorganic layer 30 may also comprise two or more materials. By allowing silicon oxide to be close to the display device, the influence of hydrogen on the stability of a thin film transistor on a drive substrate is prevented, especially the influence on the stability of an indium gallium zinc oxide (IGZO) thin film transistor, in the subsequent silicon nitride or silicon oxynitride deposition process.

Figure 2:
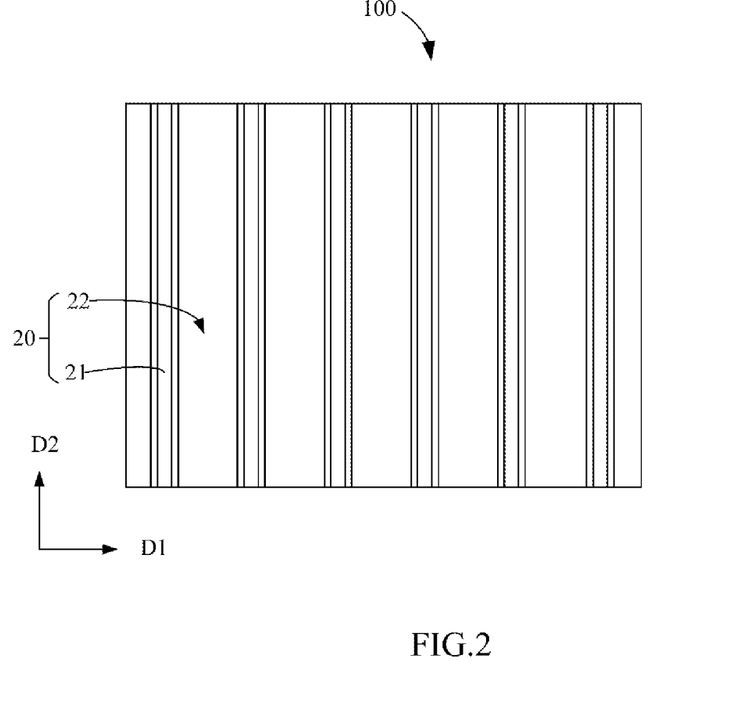
FIG. 2 is a top view of a first structure of the packaging structure of FIG. 1.
Figure 3:
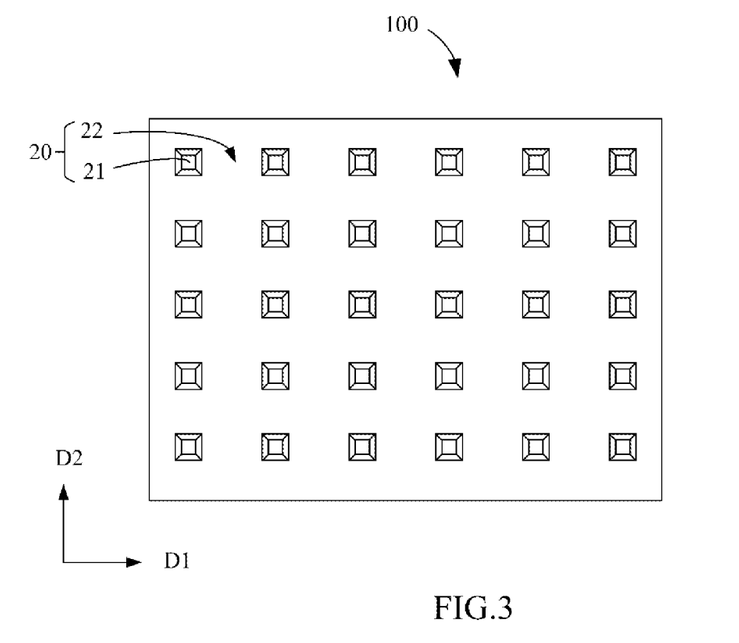
FIG. 3 is a top view of a second structure of the packaging structure of FIG. 1.

Please refer to FIG. 1 and FIG. 2. The first protrusion-recess structure 20 comprises a plurality of protrusions 21, and the plurality of protrusions 21 are arranged at intervals along a first direction D1. A groove 22 is formed between the adjacent protrusions 21. The protrusion 21 and the groove 22 constitute the first protrusion-recess structure 20 of the present disclosure. The protrusion 21 extends along a second direction D2, and the second direction D2 intersects the first direction D1. Specifically, the protrusion 21 extends from one end of the first inorganic layer 10 to another end of the second inorganic layer 30 along the second direction D2. Optionally, the second direction D2 is perpendicular to the first direction D1. As shown in FIG. 2, optionally, the protrusion 21 may extend from one end of the packaging structure 100 to another end of the packaging structure 100. As shown in FIG. 3, in other embodiments, the protrusions 21 may also be arranged in a matrix. That is, a plurality of protrusions 21 are arranged at intervals along the first direction D1 and are also arranged at intervals along the second direction D2. Correspondingly, the second protrusion-recess structure 31 comprises a plurality of protrusions 311, and the protrusions 311 of the second protrusion-recess structure 31 are arranged at intervals along the first direction D1. A groove 312 is formed between the adjacent protrusions 311. The protrusion 311 of the second protrusion-recess structure 31 is embedded in the groove 22 of the first protrusion-recess structure 20, and the protrusion 21 of the first protrusion-recess structure 20 is embedded in the groove 312 of the second protrusion-recess structure 31.

Figure 4:
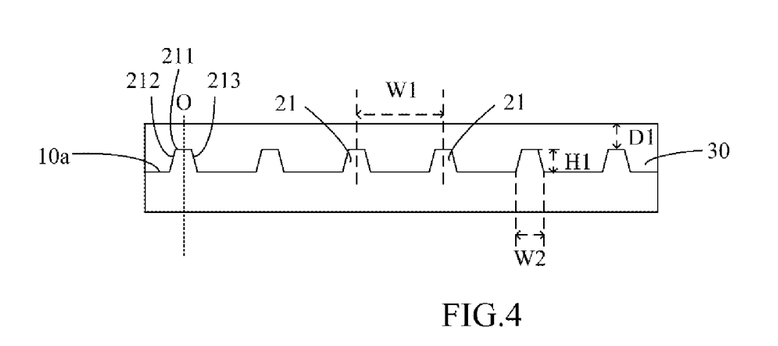
FIG. 4 is a schematic structural view of a first inorganic layer, a first protrusion-recess structure, and a second inorganic layer of FIG. 3.

Please refer to FIG. 4. Optionally, the protrusion 21 is a frustum. The protrusion 21 has a plurality of light-emitting surfaces. The plurality of light-emitting surfaces are disposed on one side away from the first inorganic layer 10. The plurality of light-emitting surfaces comprise a central surface 211, a first diffusion surface 212, and a second diffusion surface 213. The central surface 211 is parallel to the surface 10a of the first inorganic layer. When a light is emitted from the central surface 211, the light emission is perpendicular to the central surface 211. An amount of light emitted from the central surface 211 determines the brightness of the light upon upright view. The brightness upon upright view may be ensured by disposing the central surface 211. The first diffusion surface 212 and the second diffusion surface 213 are disposed oppositely and are respectively connected to opposite sides of the central surface 211. The first diffusion surface 212 and the second diffusion surface 213 are respectively connected between the central surface 211 and the surface 10a of the first inorganic layer. The first diffusion surface 212 is close to the surface 10a of the first inorganic layer along a direction away from the second diffusion surface 213. When the light is emitted from the first diffusion surface 212, the light is emitted in a direction away from the central surface 211 (or away from a center of the protrusion 21). An amount of light emitted from the first diffusion surface 212 determines the brightness of the light upon side view (for example, left view). The second diffusion surface 213 is close to the surface 10 the surface 10a of the first inorganic layer along a direction away from the first diffusion surface 212. When the light is emitted from the second diffusion surface 213, the light is emitted in a direction away from the central surface 211 (or away from the center of the protrusion 21). An amount of light emitted from the second diffusion surface 213 determines the brightness of the light upon side view (for example, right view). Optionally, both the first diffusion surface 212 and the second diffusion surface 213 are inclined planes inclined with respect to the surface 10a of the first inorganic layer. However, the directions in which the second diffusion surface 213 and the first diffusion surface 212 are inclined are opposite. That is, the first diffusion surface 212 is inclined to a first side in a vertical direction, and the second diffusion surface 213 is inclined to a second side opposite to the first side in a vertical direction. Optionally, the first side is a left side, and the second side is a right side.

Optionally, the protrusion 21 may have a symmetrical structure and have a symmetry plane O. The central surface 211 is located at a center of the protrusion 21 and is symmetrical with respect to the symmetry plane O. The second diffusion surface 213 and the first diffusion surface 212 are symmetric with respect to the symmetry plane O. By arranging the protrusions 21 in a symmetrical structure, the amount of the light emitted from both sides may be uniform, and the uniformity of the side view viewing angles may be enhanced, thereby enhancing the display quality and reducing the manufacturing difficulty. It can be understood that the protrusion 21 may also be an asymmetric structure. That is, the central surface 211 is not symmetrical with respect to the symmetry plane O. The second diffusion surface 213 and the first diffusion surface 212 are not symmetrical with respect to the symmetry plane O.

Optionally, a distance W1 between two adjacent protrusions 21 ranges from 20 μm to 60 μm. Specifically, the distance W1 may be 20 μm, 25 μm, 30 μm, 35 μm, 40 μm, 45 μm, 50 μm, 55 μm, or 60 μm. A ratio of a height H1 of the protrusion 21 perpendicular to the surface 10a of the first inorganic layer to a maximum width W2 of the protrusion 21 along the first direction D1 ranges from 1.5:1 to 1:1. Specifically the ratio may be 1.5:1, 1.3:1, 1.25:1, 1.2:1, or 1:1. The height H1 of the protrusion 21 perpendicular to the surface 10a of the first inorganic layer ranges from 1 μm to 5 μm. Specifically, the height H1 may be 1 μm, 2 μm, 3 μm, 4 μm, or 5 μm. The protrusion 21 formed a shape described above may obtain a better optical control effect. In addition, a distance D1 between a top of the protrusion 21 and a top of the second inorganic layer 30 may be ranges from 2 μm to 8 μm. Specifically, the distance D1 may be 2 μm, 3 μm, 4 μm, 5 μm, 6 μm, 7 μm, and 8 μm.

Preferably, in one embodiment, the refractive index of the first inorganic layer 10 and the first protrusion-recess structure 20 is 1.49. The refractive index of the second inorganic layer 30 is 1.67. It should be noted that the refractive index described here refers to the refractive index of light with a wavelength of 550 nm. Since the difference of the refractive index between the first protrusion-recess structure 20 and the second inorganic layer 30 will affect an optical improvement effect of the first protrusion-recess structure 20, it is preferable that the difference of the refractive index between the first protrusion-recess structure 20 and the second inorganic layer 30 is greater than 15% of the refractive index of the first protrusion-recess structure 20.

In some embodiments, the refractive index of the inorganic layer may be adjusted by adjusting a nitrogen content ratio in the silicon oxynitride, thereby adjusting an effect of the optical microstructure composed of the first protrusion-recess structure and the second inorganic layer. When silicon oxynitride approaches silicon nitride, the refractive index approaches 2.0, and when silicon oxynitride approaches silicon oxide, the refractive index approaches 1.5. By determining the nitrogen content, an optical microstructure that meets the requirements may be obtained.

For example, in a specific embodiment, the protrusion 21 is a frustum. The distance W1 between two adjacent protrusions 21 is 25.5 μm, and the ratio of the height H1 of the protrusion 21 perpendicular to the surface 10a of the first inorganic layer to the maximum width W2 of the protrusion 21 along the first direction D1 is 1.25:1. The height H1 of the protrusion 21 perpendicular to the surface 10a of the first inorganic layer is 4 μm. The distance D1 between the top of the protrusion 21 and the top of the second inorganic layer 30 is 5 μm. The packaging structure 100 described above is used in an OLED top-emission type device. After the inventor's tests, the structure improves the white light brightness viewing angle of 10 degrees. "Improving the white light brightness viewing angle of 10 degrees" refers to that under the condition that the brightness viewing angle of the white light is used as a comparative example, if the brightness at a side viewing angle of 50 degrees attenuates to be ½ of the brightness at a viewing angle of 0 degree, after using the packaging structure 100 of the present disclosure, the side viewing angle, the brightness of which attenuates to be ½ of the brightness at the viewing angle of 0 degree, may be expanded to 60 degrees. Experimental data prove that the packaging structure 100 of the present disclosure may expand the viewing angle, thereby achieving a wide viewing angle function. The measurement method of the brightness viewing angle of the present embodiment is completed by using a national standard test method, which is not redundantly described herein.

Figure 5:
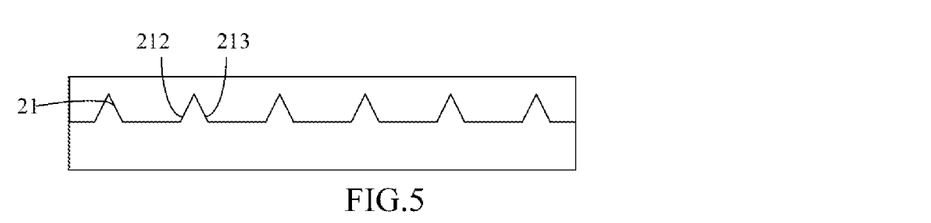
FIG. 5 is another schematic structural view of the first inorganic layer, the first protrusion-recess structure, and the second inorganic layer of the present disclosure.
Figure 6:
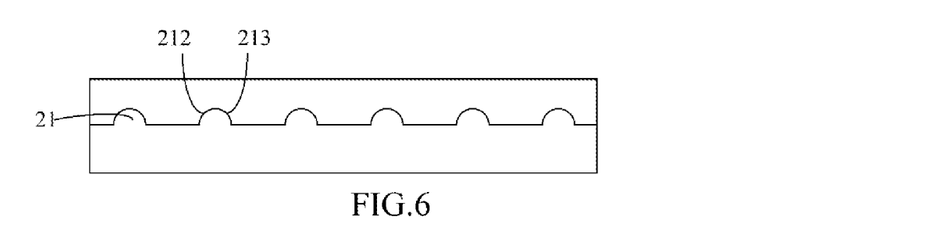
FIG. 6 is yet another schematic structural view of the first inorganic layer, the first protrusion-recess structure, and the second inorganic layer of the present disclosure.

It can be understood that the present disclosure does not limit the structure of the protrusion 21. Please refer to FIG. 5 and FIG. 6. The protrusion 21 may also be a triangular pyramid or in a hemispherical shape. The protrusion 21 may not comprise the central surface 211, and merely comprise the first diffusion surface 212 and the second diffusion surface 213 that diffuse the light in a direction away from away from the center of the protrusion 21.

In the embodiment of the present disclosure, the first protrusion-recess structure 20 formed between the first inorganic layer 10 and the second inorganic layer 30 may diffuse the light. Since the refractive index of the first inorganic layer 10 is less than the refractive index of the second inorganic layer 30, the light is refracted between the first inorganic layer 10 and the second inorganic layer 30 and refracts in a direction away from the center of the protrusion 21, thereby achieving the effect of improving the viewing angle.

Optionally, the refractive index of the first inorganic layer 10 may also be greater than the refractive index of the second inorganic layer 30. In a specific embodiment, the first inorganic layer 10 may be silicon oxynitride, and the second inorganic layer 30 may be silicon oxide. The refractive index of the first inorganic layer 10 may ranges from 1.55 to 1.951, and the refractive index of the second inorganic layer 30 may ranges from 5 to 1.55. Alternatively, the first inorganic layer 10 may be silicon nitride, and the second inorganic layer 30 may be silicon oxide. The refractive index of the first inorganic layer 10 may ranges from 2.0 to 2.2, and the refractive index of the second inorganic layer 30 may ranges from 1.5 to 1.55. Since the refractive index of aluminum oxide is close to the refractive index of silicon oxide, the silicon oxide of the second inorganic layer 30 may be replaced with aluminum oxide. Then, the second inorganic layer 30 may be aluminum oxide, and the first inorganic layer 10 may be silicon oxynitride or silicon nitride. It can be understood that the first inorganic layer 10 and the second inorganic layer 30 may also comprise two or more materials.

Under the same structure as FIG. 1, it can be understood from a reversibility of the optical path that when the refractive index is designed to be reversed, i.e., the refractive index of the first inorganic layer 10 and the first protrusion-recess structure 20 is 1.67, and the refractive index of the second inorganic layer 30 is 1.49. The first protrusion-recess structure 20 will converge light, thereby enhancing a light extraction efficiency. Moreover, in the present embodiment, the silicon nitride or silicon oxynitride is disposed on one side close to the display device to achieve a better packaging effect. Furthermore, when the packaging structure 100 is used in an OLED top-emission type device, since the refractive index of silicon nitride or silicon oxynitride effectively matches a cathode of the OLED top-emission type device, a refractive index gradient of the light extraction above the cathode may be highly compatible, so that the refractive index is increased, and a reflection loss of the light from an interface is reduced. There is no obvious reflection loss at the interface when the light is emitted above the cathode.

Optionally, the packaging structure 100 is a thin film packaging structure of OLED. The packaging structure 100 further comprises an organic packaging layer 40 and an inorganic packaging layer 50. The organic packaging layer 40 is disposed on one side of the second inorganic layer 30 away from the first inorganic layer 10. The inorganic packaging layer 50 is disposed on one side of the organic packaging layer 40 away from the second inorganic layer 30, so as to form a thin-film packaged sandwich structure with the optical microstructure formed by the first inorganic layer 10, the first protrusion-recess structure 20, and the second inorganic layer 30. An overall thickness of the packaging structure 100 may ranges from 0.3 μm to 3 μm.

Figure 7:
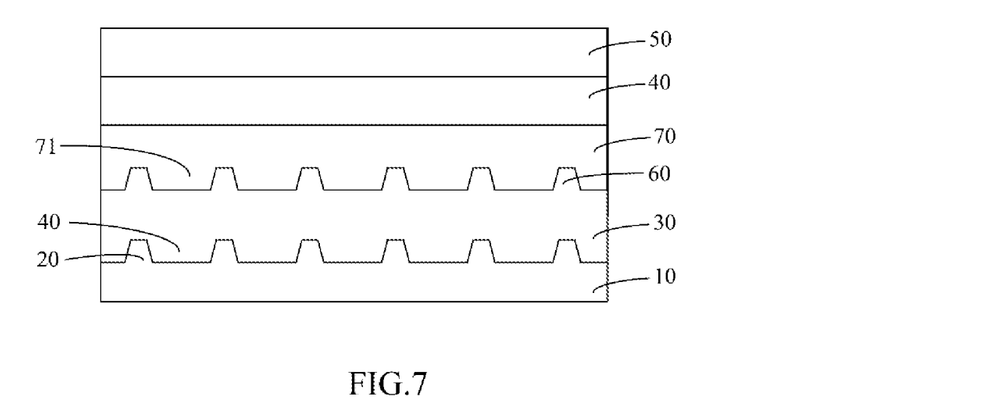
FIG. 7 is a schematic structural view of a third structure of the packaging structure of FIG. 1.

Optionally, the packaging structure 100 may further comprise more than three inorganic layers. A thickness of at least one inorganic layer ranges from about 30 nm to 100 nm. For example, the packaging structure 100 may be a stacked structure of $SiO_x/SiN_xO_y/SiO_x$ or $SiN_xO_y/SiO_x/SiN_xO_y$ from bottom to top. Further, the packaging structure 100 may be provided with a protrusion-recess structure between any two adjacent inorganic layers. As shown in FIG. 7, on the basis of the first protrusion-recess structure 20, the packaging structure 100 may further comprise a third protrusion-recess structure 60 and a third inorganic layer 70. The third protrusion-recess structure 60 is formed on one side of the second inorganic layer 30 away from the first inorganic layer 10, and the third inorganic layer 70 covers the second protrusion-recess structure 31 and the second inorganic layer 30. The third inorganic layer 70 comprises a fourth protrusion-recess structure 71. The fourth protrusion-recess structure 71 is formed on one side of the third inorganic layer 70 close to the second inorganic layer 30. The fourth protrusion-recess structure 71 and the third protrusion-recess structure 60 matches with each other. The third protrusion-recess structure 60 and the second inorganic layer 30 are formed integrally and may be formed of an organic material. By disposing multiple inorganic layers and the plurality of protrusion-recess structures, an adjustment effect of the optical performance may be further enhanced.

In the present disclosure, the optical microstructure is formed by stacking the first protrusion-recess structure 20 and the second inorganic layer 30 with different refractive indexes, which may replace an optical film used in the prior art and adjust the viewing angle or light extraction efficiency of OLED display devices.

Figure 8:
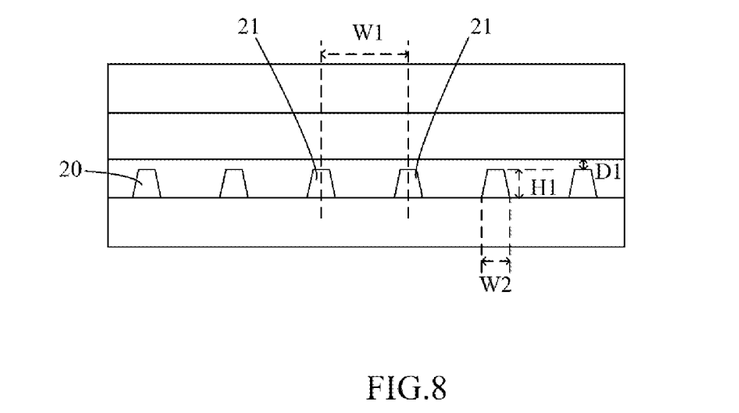
FIG. 8 is a schematic structural view of a second embodiment of the packaging structure of the present disclosure.

Please refer to FIG. 8, a material of a first protrusion-recess structure 20 of a packaging structure 100 of a second embodiment of the present disclosure is an organic material. A refractive index of the first protrusion-recess structure 20 is equal to a refractive index of the first inorganic layer 10 or between the refractive index of the first inorganic layer 10 and a refractive index of the second inorganic layer 30. A refractive index of organic photoresist on the market may reach about 1.5, which is close to a refractive index of silicon oxide. Therefore, a material of the first protrusion-recess structure 20 may be organic photoresist. Compared to inorganic materials, the organic photoresist is easier to be etched, and more configurations of the first protrusion-recess structure 20 may be manufactured. Optionally, a distance W1 between two adjacent protrusions 21 ranges from 20 μm to 60 μm. Specifically, the distance W1 may be 20 μm, 25 μm, 30 μm, 35 μm, 40 μm, 45 μm, 50 μm, 55 μm, or 60 μm. A ratio of the height H1 of the protrusion 21 perpendicular to a surface 10$a$ of the first inorganic layer to a maximum width W2 of the protrusion 21 in a first direction D1 ranges from 1.5:1 to 1:1. Specifically, the ratio may be 1.5:1, 1.3:1, 1.25:1, 1.2:1 or 1:1. The height H1 of the protrusion 21 perpendicular to the surface 10$a$ of the first inorganic layer ranges from 10 μm to 40 μm. Specifically, the height H1 may be 10 μm, 20 μm, 30 μm, or 4 μm. In addition, a distance D1 between a top of the protrusion 311 and the second inorganic layer 30 ranges from 2 μm to 8 μm. Specifically, the distance D1 may be 2 μm, 3 μm, 4 μm, 5 μm, 6 μm, 7 μm, and 8 μm.

Preferably, in one embodiment, a refractive index of the first inorganic layer 10 is 1.49. A refractive index of the first protrusion-recess structure 20 is 1.50. A refractive index of the second inorganic layer 30 is 1.67. The protrusion 21 is a frustum. A distance between two adjacent protrusions 21 is 25.5 μm, and a ratio of the height H1 of the protrusion 21 perpendicular to the surface 10$a$ of the first inorganic layer to a maximum width W1 of the protrusion 21 along a first direction D1 is 1.25:1. The height H1 of the protrusion 21 perpendicular to the surface 10$a$ of the first inorganic layer is 20 μm. A distance D1 between a top of the protrusion 21 and a top of the second inorganic layer 30 is 5 μm. The packaging structure 100 described above is used in an OLED top-emission type device. After the inventor's tests, the structure improves the white light brightness viewing angle of 14 degrees. "Improving the white light brightness viewing angle of 14 degrees" refers to that under the condition that the brightness viewing angle of the white light is used as a comparative example, if the brightness at a side viewing angle of 50 degrees attenuates to be ½ of the brightness at a viewing angle of 0 degree, after using the packaging structure 100 of the present disclosure, the side viewing angle, the brightness of which attenuates to be ½ of the brightness at the viewing angle of 0 degree, may be expanded to 64 degrees.

Figure 9:
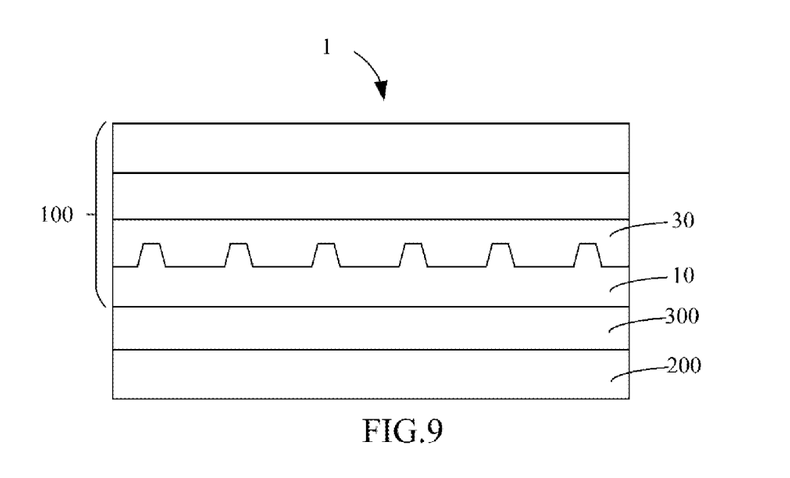
FIG. 9 is a schematic structural view of a display panel of the present disclosure.

Please refer to FIG. 9. The present disclosure further provides a display panel 1. The display panel 1 of the present disclosure may be an OLED display panel, a mini-LED display panel, a micro-LED display panel, or a QLED display panel.

The display panel 1 comprises a substrate 200, a display device 300, and the packaging structure 100 provided by the present disclosure. The display device 300 is disposed on the substrate 200. The packaging structure 100 is packaged on the display device 300. The first inorganic layer 10 is disposed between the display device 300 and the second inorganic layer 30. Optionally, the display device 300 is an OLED top-emission type display device.

The display panel 1 utilizes the packaging structure 100 provided by the present disclosure to form an optical microstructure inside a functional layer of an conventional display device without disposing an additional optical film, thereby using the functional layer of the conventional display device to achieve purposes of various optical control and solving the technical problem that the improvement of the optical performance of the conventional display device is limited by the process and materials. In addition, a difference in refractive index is present between the first inorganic layer 10, the first protrusion-recess structure 20, and the second inorganic layer 30. A stack of the first inorganic layer 10, the first protrusion-recess structure 20, and the second inorganic layer 30 may constitute a microcavity structure with a cathode of the OLED, and a degree of convergence of an emitted light may be adjusted by light interference between different layers with different refractive indexes, thereby affecting a viewing angle.

The above provides a detailed introduction to the implementation of the present disclosure, and specific examples are used herein to describe the principles and implementations of the present disclosure, and the description of the implementations above is merely used to help understand the present disclosure. Moreover, for those skilled in the art, according to a concept of the present disclosure, there will be changes in the specific embodiment and the scope of present disclosure. In summary, the content of the specification should not be construed as a limitation to the present disclosure.

What is claimed is:

1. A packaging structure, comprising:
   a first inorganic layer;
   a first protrusion-recess structure formed on the first inorganic layer, and
   a second inorganic layer covering the first inorganic layer and the first protrusion-recess structure, wherein a refractive index of the first protrusion-recess structure is less than a refractive index of the second inorganic layer, or the refractive index of the first protrusion-recess structure is greater than the refractive index of the second inorganic layer;
   wherein the second inorganic layer comprises a second protrusion-recess structure, the second protrusion-recess structure is formed on a surface of the second inorganic layer close to the first inorganic layer, and the second protrusion-recess structure and the first protrusion-recess structure match with each other.

2. The packaging structure according to claim 1, wherein the first protrusion-recess structure comprises a protrusion, the protrusion comprises a first diffusion surface and a second diffusion surface disposed oppositely, and wherein the first diffusion surface is close to a surface of the first inorganic layer in a direction away from the second diffusion surface, and the second diffusion surface is close to the surface of the first inorganic layer in a direction away from the first diffusion surface.

3. The packaging structure according to claim 2, wherein the protrusion further comprises a central surface, and the central surface is disposed between the first diffusion surface and the second diffusion surface.

4. The packaging structure according to claim 1, wherein the first inorganic layer and the first protrusion-recess structure are formed integrally.

5. The packaging structure according to claim 4, wherein the first protrusion-recess structure comprises a plurality of protrusions, the plurality of protrusions are frustums, the plurality of protrusions are arranged at intervals along a first direction and extend along a second direction, and the second direction intersects the first direction, and wherein a distance between the two adjacent protrusions ranges from 20 μm to 60 μm, and a height of the protrusion ranges from 1 μm to 5 μm.

6. The packaging structure according to claim 1, wherein a material of the first protrusion-recess structure is an organic material, and the refractive index of the first protrusion-recess structure is equal to a refractive index of the first inorganic layer or is between the refractive index of the first inorganic layer and the refractive index of the second inorganic layer.

7. The packaging structure according to claim 6, wherein the material of the first protrusion-recess structure is organic photoresist.

8. The packaging structure according to claim 6, wherein the first protrusion-recess structure comprises a plurality of protrusions, the plurality of protrusions are frustums, the plurality of protrusions are arranged at intervals along a first direction and extend along a second direction, and the second direction intersects the first direction, and wherein a distance between the two adjacent protrusions ranges from 20 μm to 60 μm, a height of the protrusion ranges from 1 μm to 5 μm, and a ratio of the height of the protrusion to a maximum width of the protrusion along the first direction ranges from 1.5:1 to 1:1.

9. The packaging structure according to claim 1, wherein the packaging structure further comprises a third protrusion-recess structure and a third inorganic layer, the third protrusion-recess structure is formed on one side of the second inorganic layer away from the first inorganic layer, and the third inorganic layer covers the third protrusion-recess structure and the second inorganic layer.

10. A display panel, comprising:
a substrate;
a display device disposed on the substrate, and
a packaging structure disposed on one side of the display device away from the substrate, wherein the packaging structure comprises:
a first inorganic layer;
a first protrusion-recess structure formed on the first inorganic layer;
a second inorganic layer covering the first inorganic layer and the first protrusion-recess structure, wherein a refractive index of the first protrusion-recess structure is less than a refractive index of the second inorganic layer, or the refractive index of the first protrusion-recess structure is greater than the refractive index of the second inorganic layer, and the first inorganic layer is disposed between the display device and the second inorganic layer;
wherein the second inorganic layer comprises a second protrusion-recess structure, the second protrusion-recess structure is formed on a surface of the second inorganic layer close to the first inorganic layer, and the second protrusion-recess structure and the first protrusion-recess structure match with each other.

11. The display panel according to claim 10, wherein the first protrusion-recess structure comprises a protrusion, the protrusion comprises a first diffusion surface and a second diffusion surface disposed oppositely, and wherein the first diffusion surface is close to a surface of the first inorganic layer in a direction away from the second diffusion surface, and the second diffusion surface is close to the surface of the first inorganic layer in a direction away from the first diffusion surface.

12. The display panel according to claim 11, wherein the protrusion further comprises a central surface, and the central surface is disposed between the first diffusion surface and the second diffusion surface.

13. The display panel according to claim 10, wherein the first inorganic layer and the first protrusion-recess structure are formed integrally.

14. The display panel according to claim 13, wherein the first protrusion-recess structure comprises a plurality of protrusions, the plurality of protrusions are frustums, the plurality of protrusions are arranged at intervals along a first direction and extend along a second direction, and the second direction intersects the first direction, and wherein a distance between the two adjacent protrusions ranges from 20 μm to 60 μm, and a height of the protrusion ranges from 1 μm to 5 μm.

15. The display panel according to claim 10, wherein a material of the first protrusion-recess structure is an organic material, and the refractive index of the first protrusion-recess structure is equal to a refractive index of the first inorganic layer or is between the refractive index of the first inorganic layer and the refractive index of the second inorganic layer.

16. The display panel according to claim 15, wherein the material of the first protrusion-recess structure is organic photoresist.

17. The display panel according to claim 15, wherein the first protrusion-recess structure comprises a plurality of protrusions, the plurality of protrusions are frustums, the plurality of protrusions are arranged at intervals along a first direction and extend along a second direction, and the second direction intersects the first direction, and wherein a distance between the two adjacent protrusions ranges from 20 μm to 60 μm, a height of the protrusion ranges from 10 μm to 40 μm, and a ratio of the height of the protrusion to a maximum width of the protrusion along the first direction ranges from 1.5:1 to 1:1.

18. The display panel according to claim 10, wherein the packaging structure further comprises a third protrusion-recess structure and a third inorganic layer, the third protrusion-recess structure is formed on one side of the second inorganic layer away from the first inorganic layer, and the third inorganic layer covers the third protrusion-recess structure and the second inorganic layer.

* * * * *